(12) United States Patent
Crump et al.

(10) Patent No.: US 8,537,869 B2
(45) Date of Patent: Sep. 17, 2013

(54) BROAD AREA DIODE LASER WITH HIGH EFFICIENCY AND SMALL FAR-FIELD DIVERGENCE

(75) Inventors: Paul Crump, Berlin (DE); Goetz Erbert, Löbau (DE); Hans Wenzel, Berlin (DE); Joerg Fricke, Berlin (DE)

(73) Assignee: Forschungsverbund Berlin e.V., Berlin (DE)

( * ) Notice: Subject to any disclaimer, the term of this patent is extended or adjusted under 35 U.S.C. 154(b) by 0 days.

(21) Appl. No.: 13/464,495

(22) Filed: May 4, 2012

(65) Prior Publication Data

US 2012/0287957 A1    Nov. 15, 2012

(30) Foreign Application Priority Data

May 9, 2011    (DE) .......................... 10 2011 075 502

(51) Int. Cl.
*H01S 5/00* (2006.01)
(52) U.S. Cl.
USPC ....................................... 372/45.01
(58) Field of Classification Search
USPC .................... 372/50.124, 45.01; 359/483.01
See application file for complete search history.

(56) References Cited

U.S. PATENT DOCUMENTS

| 4,166,253 | A | * | 8/1979 | Small et al. ............... 372/45.01 |
| 4,965,806 | A | | 10/1990 | Ashby et al. |
| 5,272,711 | A | | 12/1993 | Mawst et al. |
| 5,966,396 | A | | 10/1999 | Okazaki et al. |
| 6,141,365 | A | | 10/2000 | Bowler |
| 6,167,073 | A | | 12/2000 | Botez et al. |
| 2011/0317732 | A1 | * | 12/2011 | Eckstein et al. ........... 372/46.01 |

FOREIGN PATENT DOCUMENTS

| WO | 2004/027951 A1 | 4/2004 |
| WO | 2009/063720 A1 | 5/2009 |
| WO | 2010/057955 A1 | 5/2010 |

* cited by examiner

*Primary Examiner* — Jessica T Stultz
*Assistant Examiner* — Tuan Nguyen
(74) *Attorney, Agent, or Firm* — Norris McLaughlin & Marcus, P.A.

(57) ABSTRACT

A broad area laser, with high efficiency and small far-field divergence, has an active layer, a first contact and a second contact, each having a width larger than 10 μm. An anti-wave guiding layer, which is positioned laterally with respect to the active region, is enclosed between the first and second contacts, wherein a refractive index of the anti-wave guiding layer is larger than a minimum refractive index of cladding layers. A minimum distance between the anti-wave guiding layer and a projection of one of the contacts on the plane of the anti-wave guiding layer is between 0 and 100 μm.

13 Claims, 12 Drawing Sheets

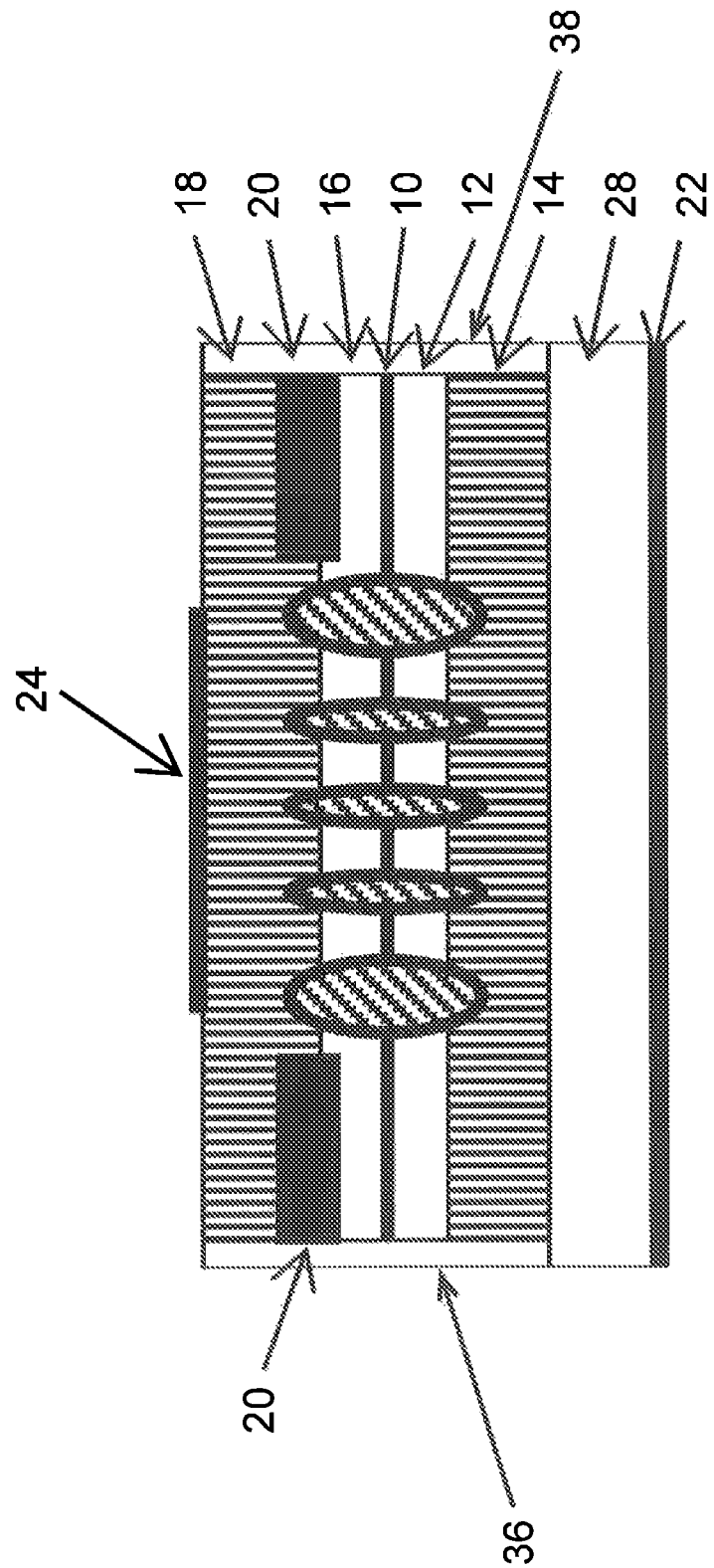

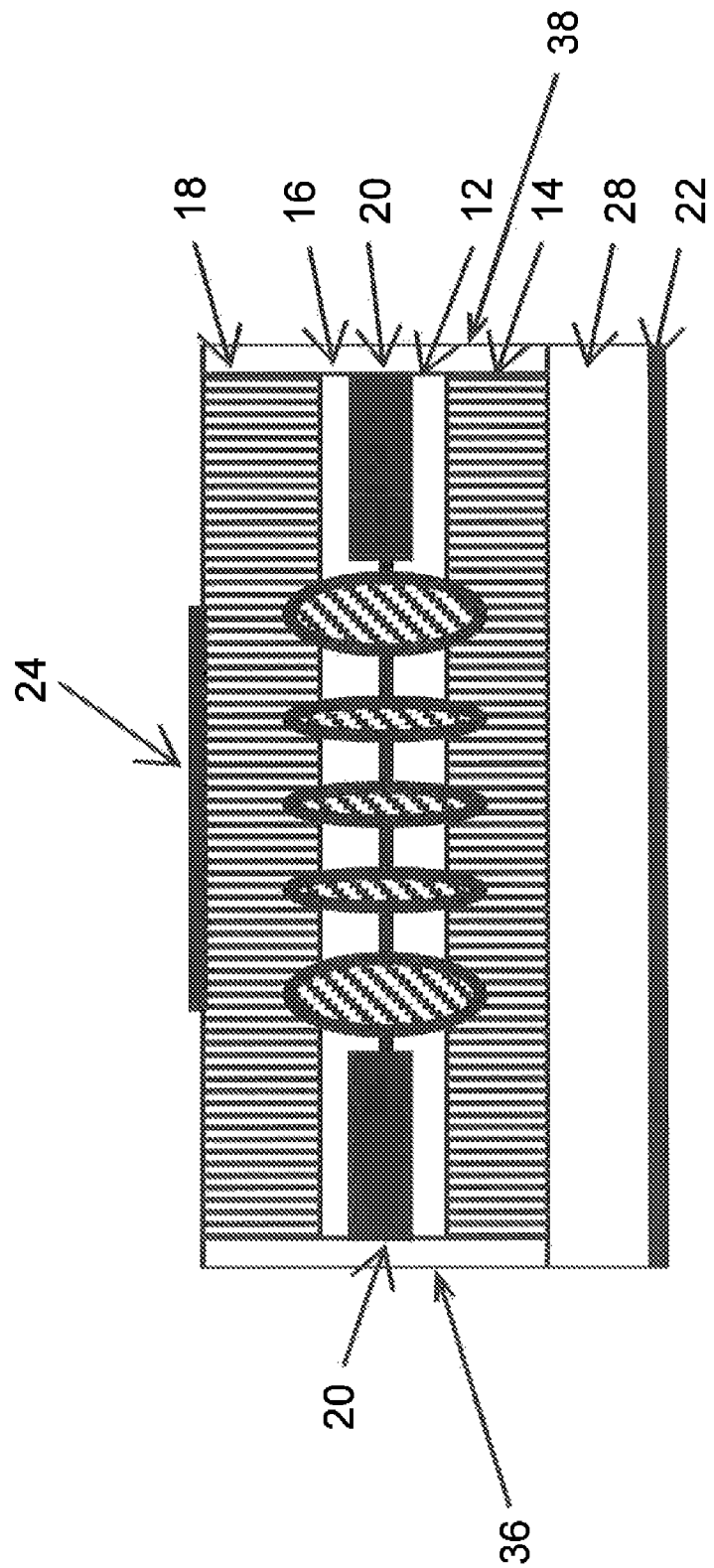

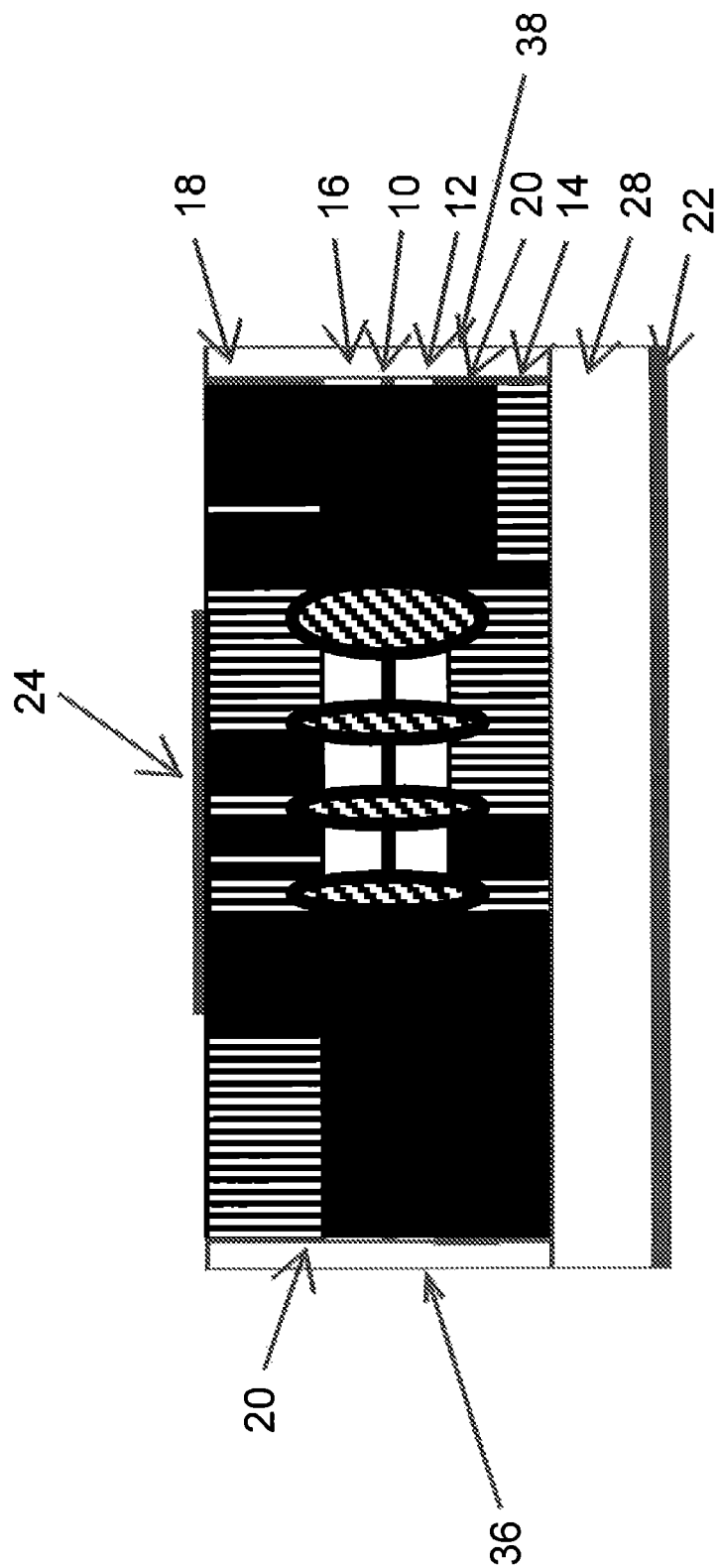

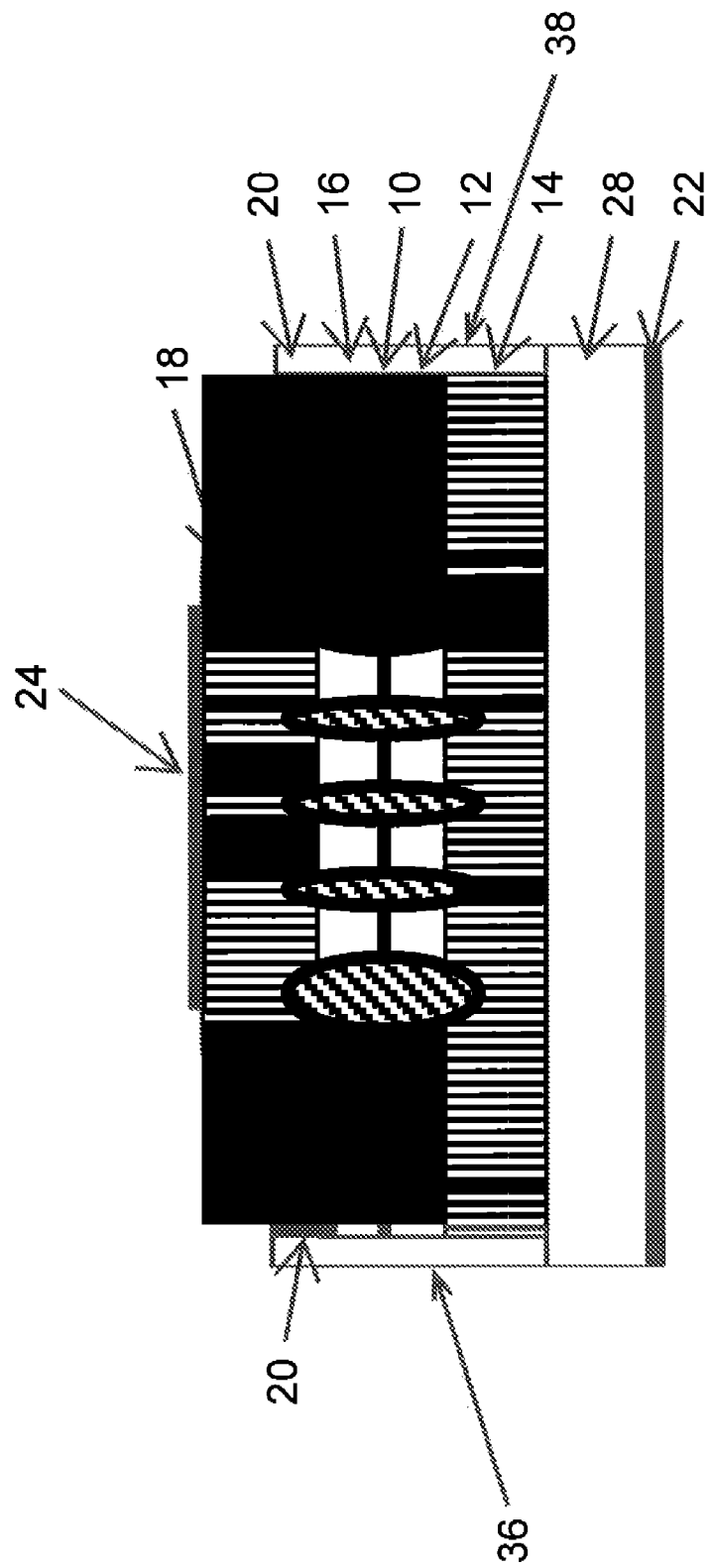

BROAD AREA DIODE LASER WITH HIGH EFFICIENCY AND SMALL FAR-FIELD DIVERGENCE

The present invention relates to a diode laser with high efficiency and small far-field divergence.

BACKGROUND OF THE INVENTION

Laser diodes (hereinafter also referred to as diode lasers) generally have an active layer which is embedded between semiconductor layers, said semiconductor layers differing in their band-gaps, refractive indices and doping. The layers below and above the active layer differ in their conduction type (n or p). Apart from providing for the transport of electrons and holes to the active layer, where they recombine in an excited state and produce laser radiation, these layers support the vertical guiding of the laser light. The layers adjacent to the active layers are referred to as wave guiding layers, and the layers adjacent to said wave guiding layers are called cladding layers. The refractive index of the active layer is typically higher than the refractive index of the wave guiding layers, and the refractive index of the wave guiding layers is typically higher than the refractive index of the cladding layers. However, other configurations are possible as well (e.g. Vertical ARROW, Photonic Band Crystal).

Parameters such as power, efficiency, beam quality, narrow spectral linewidth and reliability are important criteria for using high-power diode lasers instead of solid-state lasers. Broad area single emitter lasers are diode lasers optimised for high optical output power. High output power is achieved by pumping large areas with apertures (stripe widths) larger than 10 µm, for example between 30 and 400 µm, and resonator lengths of up to 10 mm.

However, the use of broad area lasers with high output power instead of solid-state lasers is restricted by the lateral divergence of the emitted radiation, which increases with increasing output power. The focusability of the emitted radiation thus decreases, which is a disadvantage in many application situations, such as in materials processing. This effect is mainly due to the formation of a thermally induced waveguide which, with increased output power, leads to stable lasing of lateral modes of (ever) higher orders. Since the divergence in the far field increases with increasing order of the lateral modes, higher output power leads to an unwanted lateral widening of the beam, as FIG. 1 illustrates.

FIG. 1 shows the intensity distribution in the lateral far field of a conventional broad area laser with a stripe width of 90 µm for different levels of output power.

The laser is heated by the part of the current flowing into the laser and by the part of the emitted light which is absorbed again. The heating takes place in particular in the active region directly below the upper contact stripe through which current is flowing. This leads to a local increase in the refractive indices, since the refractive indices of the compound semiconductors used increase with increasing temperature at the laser wavelength. The positive difference of the refractive indices between the active region and the lateral passive region (which is not positioned directly below the contact stripe) leads to the formation of a lateral waveguide that can carry several lateral modes. The difference of the refractive indices continues to increase with increasing output power, so that lateral modes of ever higher orders are carried, said lateral modes eventually reaching the lasing threshold.

To reduce the lateral far-field divergence, U.S. Pat. No. 4,965,806 suggests to imprint the upper waveguide with a lateral thickness variation to compensate for the increased refractive index. However, this is a disadvantage because the compensation created through the thickness variation can only be implemented for a particular output power. The high cost of implementing a non-planar waveguide is a further disadvantage.

In another embodiment, U.S. Pat. No. 4,965,806 suggests an imprinted lateral temperature profile created by heating elements arranged laterally to the active region. The disadvantage of this apparatus is that additional electrical connections are required. In addition, this apparatus is not compatible with p-down mounting for better heat dissipation. Furthermore, the high cost of the additional heating elements is a disadvantage.

To suppress higher order lateral modes, U.S. Pat. No. 6,141,365 and WO 2004/027951 A1 suggest absorption layers arranged laterally to the active region, said absorption layers leading to losses of higher order lateral modes. Such absorption layers, however, can be used sensibly only for small stripe widths <10 µm, i.e. for power <2 W, since the higher order lateral modes of broad area lasers are located primarily in the active region, which means that absorption layers arranged laterally can not, or only to a negligible degree, influence said lateral modes. Furthermore, such absorption layers can only be used for modes with strongly different lateral profiles, because the fundamental mode would otherwise also be weakened too much, which would lead to a low efficiency of the device.

WO 2010/057955 A1 uses lattice structures to decrease the feedback of higher order modes, but the manufacturing of said lattice structures is complex and hence expensive.

DISCLOSURE OF THE INVENTION

It is thus the object of the present invention to provide a broad area laser (stripe width >10 µm) with a small far-field divergence but also with high output power. In addition, it should be possible to produce the broad area laser of the present invention inexpensively.

These problems are solved according to the invention through the features of claim 1. Useful embodiments of the invention are the subject of the subclaims.

The concept of the present invention is to insert an additional layer, hereinafter also referred to as anti-wave guiding layer, which is positioned laterally to (outside, preferably completely outside) the active region through which current is flowing. This layer has a sufficiently large refractive index. At certain thicknesses of the layers, said thicknesses depending on the refractive index, a resonant uncoupling of higher order lateral modes into these anti-wave guiding layers takes place which is larger if the mode is of higher order. This uncoupling leads to losses in the lateral modes, said losses increasing with the order of the modes. For this reason, higher order lateral modes can be suppressed according to the invention by resonant uncoupling. The wave guiding layer and the cladding layer can thus advantageously have planar shape, and additional heating elements can be dispensed with. Since the higher order lateral modes are suppressed by resonant uncoupling and not by absorption, the anti-wave guiding layer may still be (strongly) absorbent but it does not have to be. A further advantage lies in the fact that a resonantly uncoupling anti-wave guiding layer may be efficiently used, in particular, in diode lasers with marginally different lateral profiles, i.e. in broad area lasers.

The diode laser of the present invention has a first contact, a first cladding layer, a first wave guiding layer, an active layer, a second wave guiding layer, a second cladding layer and a second contact, which are preferably formed as a layer stack. To facilitate the operation as a laser, the active layer, the first contact and the second contact each extend at least partially between an emitting facet and a reflecting facet.

According to the invention, the active layer, the first contact and the second contact each have a (maximum) width larger than 10 μm, and an anti-wave guiding layer is positioned laterally to (outside) the active region enclosed between the contacts, wherein the refractive index of the anti-wave guiding layer is at least larger than the minimum refractive index of the cladding layers, wherein the minimum distance between the anti-wave guiding layer and a projection of one of the contacts on the plane of the anti-wave guiding layer lies between 0 and 50 μm, more preferably between 5 and 50 μm and even more preferably between 10 and 50 μm. A minimum distance larger than zero is preferred in order to minimize unwanted attenuation for modes of smaller order.

In a preferred embodiment of the invention, an anti-wave guiding layer each is arranged on each side of the active region between the facets. The (at least one) anti-wave guiding layer is positioned laterally to the side of (outside) the active region and vertically at any position inside the lateral layer sequence. The optimum position depends on the materials used. The anti-wave guiding layer may be arranged below or above one of the two cladding layers, inside one of the cladding layers or, preferably, in the region between the two cladding layers. The active region according to the present invention is the region enclosed between the contacts—provided that both contacts have the same width over their whole lengths. If the two contacts have different widths over their (at least partial) lengths, the active region according to the present invention is the region enclosed through a vertical projection of the (at the respective position) narrower contact on the opposite contact.

Preferably, the active layer, the first contact and the second contact each extend completely between the emitting facet and the reflecting facet, but this is not strictly necessary. Preferably, the (at least one) anti-wave guiding layer extends also completely between the facets, but again this is not strictly necessary. Preferably, the (at least one) anti-wave guiding layer extends over at least 30%, more preferably over at least 50% and even more preferably over at least 80% of the longitudinal extension of the active layer.

The effective refractive index $n1_{\it eff}$ in the active region is defined by solving the following one-dimensional vertical waveguide equation $$\frac{d^2 E_{active\ region}}{dy^2} + \frac{4\pi^2}{\lambda^2}(n_{active\ region}(y)^2 - n1^2_{\it eff})E(y)_{active\ region} = 0$$

wherein $n_{active\ region}(y)$ is the profile of the refractive indices of the layer sequence in the active region, λ is the laser wavelength, $E_{active\ region}(y)$ is the profile of the electric field strength in the active region, and y is the vertical space coordinate in the active region. The solution for $n1_{\it eff}$, the modulus square of the electric field strength of which is largest in the active layer, determines the vertical profile of the electric field strength of the lasing modes in the active region. In this case, the layer sequence consists at least of the first cladding layer, the first wave guiding layer, the active layer, the second wave guiding layer and the second cladding layer. The contact layers and substrate layers arranged on the periphery can be taken into account as well, if necessary. The effective refractive index $n2_{\it eff}$ in the region to the side of (outside) the active region, where the anti-wave guiding layer is arranged, is defined by solving the following one-dimensional vertical waveguide equation $$\frac{d^2 E_{side\ region}}{dy^2} + \frac{4\pi^2}{\lambda^2}(n_{side\ region}(y)^2 - n2^2_{\it eff})E_{side\ region}(y) = 0$$

wherein $n_{side\ region}(y)$ represents the profile of the refractive indices of the layer sequence in the region to the side of the active region, in which the anti-wave guiding layer is arranged, λ is the laser wavelength, $E_{side\ region}(y)$ is the profile of the electric field strength in the region to the side of the active region, in which the anti-wave guiding layer is arranged, and y is the vertical space coordinate in the region to the side of the active region, in which the anti-wave guiding layer is arranged. The solution for $n2_{\it eff}$, the modulus square of the electric field strength of which is largest in the active layer, determines the vertical profile of the electric field strength of the lasing modes in the region to the side of the active region. If the anti-wave guiding layer is located in the region to the side of the active region, there are further solutions for $n2_{\it eff}$. In this case, the layer sequence consists of the anti-wave guiding layer and all of the following layers: first cladding layer, first wave guiding layer, active layer, second wave guiding layer and second cladding layer, provided that these layers are present in the region to the side of the active region, in which the anti-wave guiding layer is arranged.

The resonant uncoupling according to the present invention occurs when the refractive index and the thickness of the anti-wave guiding layer are chosen such that, during the operation of the laser, the effective index $n1_{\it eff}$ in the active region is approximately equal to the effective index $n2_{\it eff}$ in the region to the side of the active region, in which the anti-wave guiding layer is arranged.

Preferably, the thickness and the refractive index of the (at least one) anti-wave guiding layer are chosen such that the absolute value of the difference between $n1_{\it eff}$ and $n2_{\it eff}$, that is, $|n1_{\it eff}-n2_{\it eff}|$ is <0.15, more preferably <0.10, even more preferably <0.05. In a preferred embodiment, the effective refractive index $n1_{\it eff}$ in the active region is larger than the effective refractive index $n2_{\it eff}$ in the region to the side of (outside) the active region. In an alternative preferred embodiment, the effective refractive index $n1_{\it eff}$ in the active region is smaller than the effective refractive index $n2_{\it eff}$ in the region to the side of (outside) the active region.

In a particularly preferred embodiment, $n1_{\it eff}$ equals $n2_{\it eff}$.

Preferably, one anti-wave guiding layer is positioned on each longitudinal side of the active layer. Preferably, the two anti-wave guiding layers are positioned symmetrically to a centred longitudinal axis of the active layer. Preferably, the width, layer thickness, distance from the active region and refractive index of the two anti-wave guiding layers are the same in each instance.

Preferably, the refractive index of the (at least one) anti-wave guiding layer is larger than the minimum refractive index of the cladding layers. Provided that the refractive indices of the cladding layers are the same, the refractive index of the (at least one) anti-wave guiding layer must be larger than the refractive index of the cladding layers.

The refractive indices always relate to the laser wavelength. More preferably, the refractive index of the (at least one) anti-wave guiding layer is larger than the arithmetic mean of the refractive indices of the cladding layers. Preferably, the refractive index of the (at least one) anti-wave guiding layer is larger than the maximum refractive index of the cladding layers.

Preferably, the refractive index of the (at least one) anti-wave guiding layer is larger than the minimum refractive index of the wave guiding layers. Provided that the refractive indices of the wave guiding layers are the same, the refractive index of the (at least one) anti-wave guiding layer is preferably larger than the refractive index of the wave guiding layers.

More preferably, the refractive index of the (at least one) anti-wave guiding layer is larger than the arithmetic mean of the refractive indices of the wave guiding layers. Preferably, the refractive index of the (at least one) anti-wave guiding layer is larger than the maximum refractive index of the wave guiding layers.

More preferably, the refractive index of the (at least one) anti-wave guiding layer is larger than the effective refractive index $n1_{eff}$ in the active region.

The anti-wave guiding layer can perform a resonant uncoupling of the higher order lateral modes particularly efficiently if its refractive index is large in comparison to the refractive indices of the layers in the active region.

Preferably, the minimum vertical distance between the active layer and the anti-wave guiding layer is smaller than the sum of the layer thickness of the first cladding layer and the layer thickness of the first wave guiding layer. Preferably, the minimum vertical distance between the active layer and the anti-wave guiding layer is smaller than the sum of the layer thickness of the second cladding layer and the layer thickness of the second wave guiding layer.

Preferably, the first cladding layer and the first wave guiding layer are n-conducting and the second cladding layer and the second wave guiding layer are p-conducting.

Preferably, the minimum vertical distance between the active layer and the anti-wave guiding layer is less than the layer thickness of the p-conducting second wave guiding layer. More preferably, the vertical distance between the active layer and the anti-wave guiding layer is between 40% and 100% of the layer thickness of the second wave guiding layer.

Preferably, the minimum lateral distance between the anti-wave guiding layer and the projection of the contact that displays a smaller width on the plane of the anti-wave guiding layer is between 0 and 50 μm, preferably between 5 and 50 μm and still more preferably between 10 and 50 μm. The resonant uncoupling of the higher order lateral modes can then be especially efficient without additional attenuation for smaller order modes.

Preferably, the active layer, the first contact and the second contact each have a width of more than 10 μm, more preferably between 20 and 800 μm and even more preferably between 30 and 400 μm. In particular, high output power will be achieved by pumping large areas with apertures (stripe widths) larger than 10 μm, preferably between 20 and 800 μm and more preferably between 30 and 400 μm, and resonator lengths of up to 10 mm. Independent of the width of the contacts and the active layer, the intention in accordance with the invention is for the area in the region of the active layer through which current is flowing to have a width greater than 10 μm, more preferably between 20 and 800 μm and even more preferably between 30 and 400 μm.

Preferably the lateral width of the anti-wave guiding layer is greater than $\lambda/n2_{eff}$, preferably greater than ten times $\lambda/n2_{eff}$, more preferably hundred times greater than $\lambda/n2_{eff}$. In a preferred embodiment (where λ is 980 nm and $n2_{eff}$ is 3.5) the anti-wave guiding layer extends away from both sides of the area through which current is flowing, over a region of at least 2.8 μm, more preferably at least 10 μm and even more preferably at least 28 μm. In a particularly preferred embodiment the anti-wave guiding layer extends away from both sides of the area through which current is flowing in a direction that in each case leads (laterally) away from the area through which current is flowing up to a region into which the wave guiding layers and cladding layers (laterally) extend. Particularly preferably, the anti-wave guiding layer is (laterally) flush with the wave guiding layers and the cladding layers.

Preferably, the anti-wave guiding layer is made of germanium for the wavelength range between 0.3 μm and 100 μm. Alternatively another material (semiconductor, insulator, metal) with an adequate refractive index can be used instead of germanium. GaAs, for example, has a large enough refractive index in the wavelength range between 0.25 μm and 1.55 μm. The optimum thickness depends on the refractive index of the anti-wave guiding layer and the laser wavelength.

Preferably, the layer structure consisting of the first cladding layer, the first wave guiding layer, the active layer, the second wave guiding layer and the second cladding layer is arranged on a semi-conducting carrier substrate. The contacts can preferably be attached below the substrate and above the upper wave guiding layer.

Preferably, the first cladding layer, the first wave guiding layer, the active layer, the second wave guiding layer and the second cladding layer are made of semi-conducting materials.

Preferably, the first cladding layer, the first wave guiding layer, the active layer, the second wave guiding layer, the second cladding layer and the anti-wave guiding layer each have planar shape. Preferably, the first cladding layer, the first wave guiding layer, the active layer, the second wave guiding layer, the second cladding layer and the anti-wave guiding layer each have a uniform layer thickness.

Preferably, the active layer, the first contact and/or the second contact are in the form of stripes. Alternatively any other forms, e.g. trapezoid (wide-stripe trapezoidal laser), can be used instead of a rectangular contact stripe.

It is furthermore possible to design the diode laser according to the present invention as a multi-section laser with different geometries and designs of the contact stripe, e.g. as trapezoidal laser consisting of an RW (ridge waveguide) section and a trapezoid section. Other alternative embodiments with several sections are also conceivable.

Preferably, the minimum lateral distance between the anti-wave guiding layer and a projection of the contact that displays a smaller width on the plane of the anti-wave guiding layer is uniform along the longitudinal extension of the anti-wave guiding layer.

In a further embodiment of the invention the anti-wave guiding layer can consist not of a single layer but of a sequence of layers. The conditions cited for the anti-wave guiding layer would then apply analogously to the layer sequence.

The anti-wave guiding layer according to the present invention may be implemented as a surface layer. An alternative option is to implement the anti-wave guiding layer as an epitaxially grown buried layer consisting of compound semi-conductors of (Al, In, Ga) and (As, P, Sb, N). The anti-wave guiding layer is preferably produced by sputtering, epitaxy, implantation or diffusion.

The anti-wave guiding layer must have a lateral width larger than $\lambda/n2_{eff}$, preferably larger than $10 \times \lambda/n2_{eff}$, more preferably larger than $100 \times \lambda/n2_{eff}$.

The reflecting facet, which reflects the radiation emitted by the active layer, and the emitting facet, which reflects and uncouples the radiation emitted by the active layer, are preferably arranged in the edge region of the active layer and opposing each other in relation to the active layer.

Preferably, the active layer is designed uniformly. Preferably, the uniformity of the active layer extends over its entire length between the facets, more preferably over its entire extent. Uniformity of the active layer according to the present invention means that the layer parameters (such as chemical composition, doping, layer thickness, refractive index) diverge by less than 10%, more preferably by less than 5%, more preferably by less than 1%, most preferably not at all, in relative terms (maximum to minimum) at any point of the abovementioned extent.

Preferably, the active layer extends over the entire region between the reflecting facet and the emitting facet. Preferably, the active layer directly contacts both the reflecting facet and the emitting facet. The active layer may also be positioned at a distance of between 0 and 500 µm to the facets, for example by using implantation, intermixing or overgrowing, in order to prevent a destruction of the facet(s) which would lead to a malfunction of the laser.

Preferably, the first cladding layer and the first wave guiding layer are arranged on a first side of the active layer, and the second wave guiding layer and the second cladding layer are arranged on a second, opposing side of the active layer.

Preferably, the diode laser is designed as an edge-emitting diode laser.

Preferably, the surfaces of the reflecting facet and the emitting facet have planar shape. Preferably, the surfaces of the reflecting facet and the emitting facet are arranged parallel to one another. Preferably, the longitudinal axis of the first wave guiding layer and the longitudinal axis of the second wave guiding layer extend perpendicular to the surfaces of the reflecting facet and the emitting facet. The wave guiding layers according to the present invention are preferably the layers directly adjacent to both sides of the active layer. The cladding layers according to the present invention are preferably those layers directly adjacent to the wave guiding layers which are facing away from the active layer.

Preferably, the wave guiding layers and the cladding layers are designed uniformly. Preferably, the uniformity extends over their entire length between the facets, more preferably over their entire extent. Uniformity according to the present invention means that the layer parameters (such as chemical composition, doping, layer thickness, refractive index) diverge by less than 10%, more preferably by less than 5%, more preferably by less than 1%, most preferably not at all, in relative terms (maximum to minimum) at any point of the abovementioned extent.

The refractive index of the first cladding layer is preferably lower than the refractive index of the first wave guiding layer. The refractive index of the second cladding layer is preferably lower than the refractive index of the second wave guiding layer.

Preferably, the first wave guiding layer and the second wave guiding layer are made of the same material.

Preferably there is a carrier substrate on which the abovementioned layer structure is built. Preferably, the n-conducting layers are arranged on that side of the active layer which faces the carrier substrate, while the p-conducting layers are arranged on that side of the active layer which faces away from the carrier substrate.

The diode laser of the present invention is preferably designed in such a way that it can carry, during operation, apart from the fundamental lateral mode, at least one higher order lateral mode.

Preferably, the first wave guiding layer in the active region through which current is flowing has a (laterally) uniform layer thickness and/or a (laterally) uniform refractive index. Preferably, the second wave guiding layer in the active region through which current is flowing has a (laterally) uniform layer thickness and/or a (laterally) uniform refractive index.

Preferably, the entire anti-wave guiding layer is made of a material that has a level of absorption of between 50% and 200% of the level of absorption of the wave guiding layers in the wavelength range between 0.3 µm and 2 µm.

BRIEF DESCRIPTION OF THE DRAWINGS

In the following, the invention will be explained in detail using some embodiments, in which:

FIGS. 3a-3g show the different possibilities of implementing the anti-wave guiding layer as a buried layer or as a surface layer.

DETAILED DESCRIPTION OF THE DRAWINGS

Figure 1:
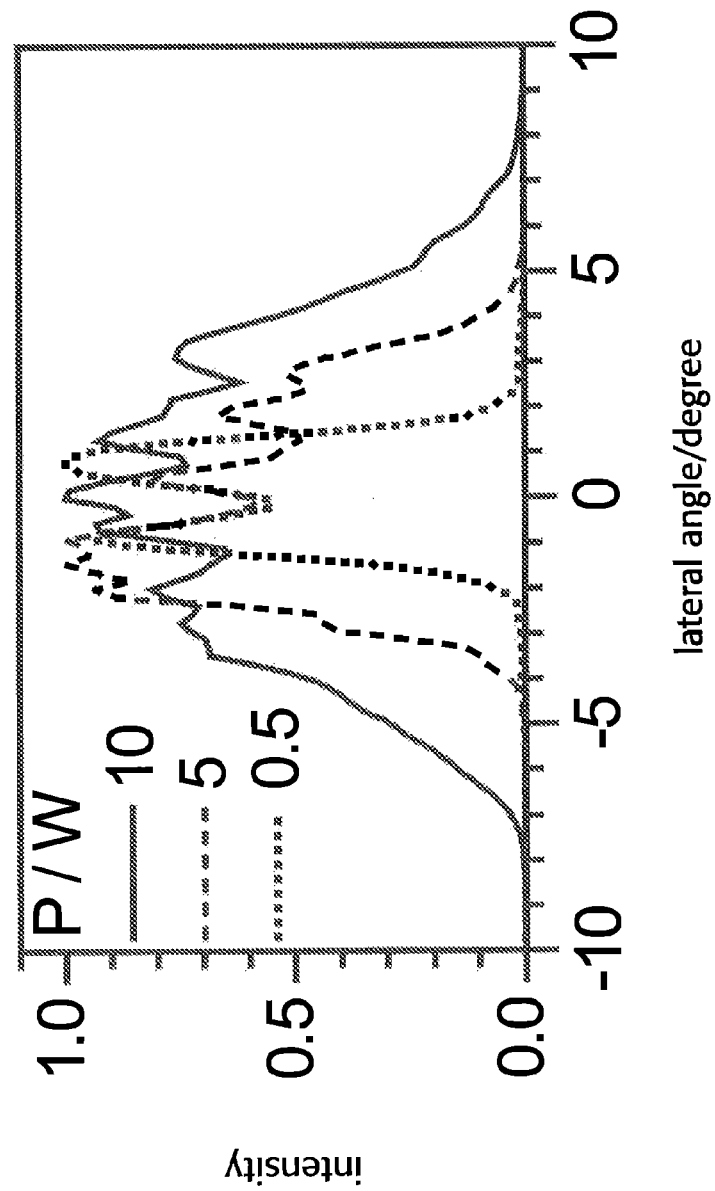
FIG. 1 shows the intensity distribution in the lateral far field of a conventional broad area laser for different levels of output power.
Figure 2A:
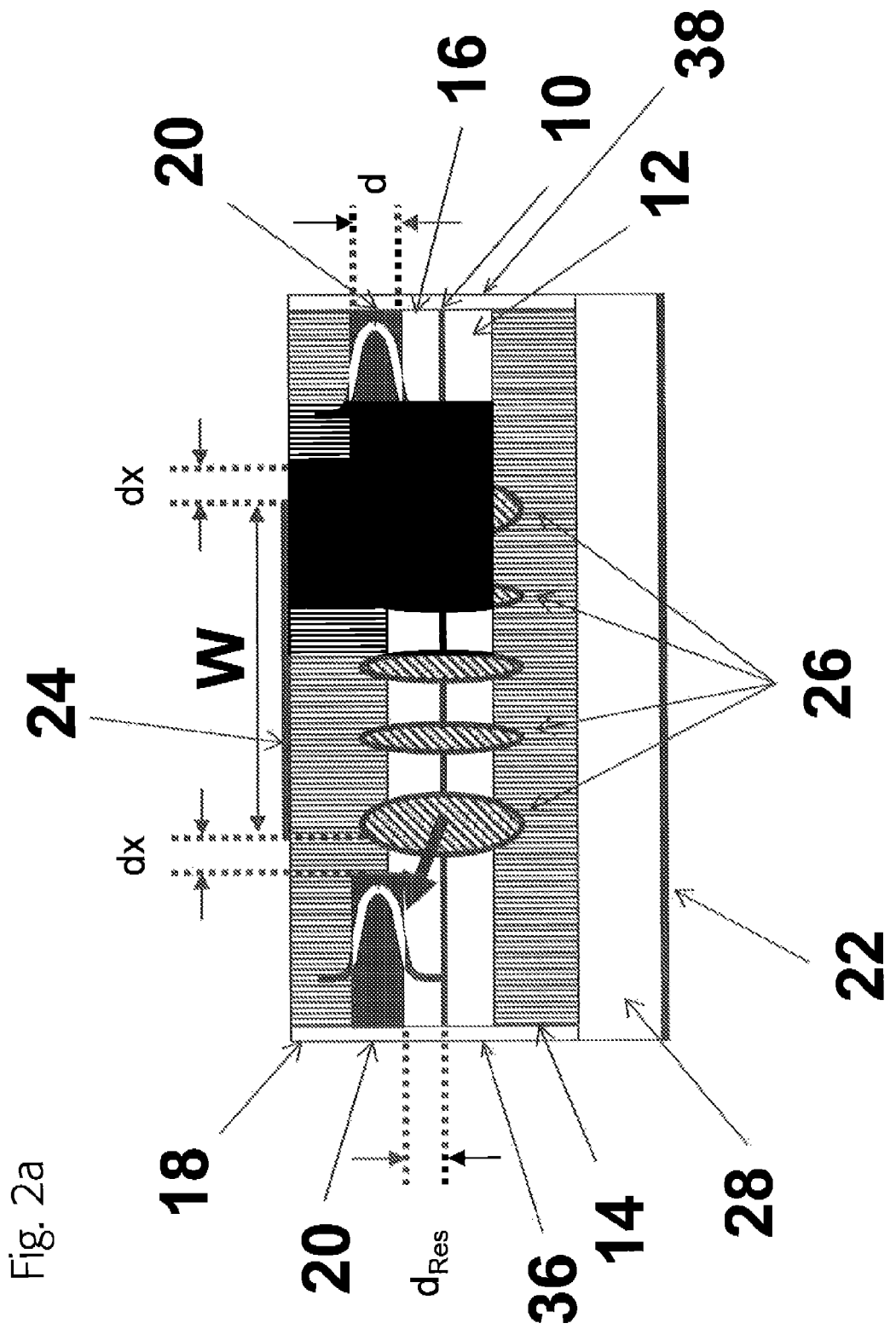
FIG. 2a shows a laser diode of the present invention in a schematic cross-sectional view.

FIG. 2a shows a broad area laser of the present invention in a schematic cross-sectional view.

The laser diode of the present invention has a vertical layer structure with a substrate 28, a first n-conducting cladding layer 14 arranged on said substrate, a first n-conducting wave guiding layer 12 arranged on said first cladding layer, an active layer 10 arranged on said first wave guiding layer, a second p-conducting wave guiding layer 16 arranged on said active layer, and a second p-conducting cladding layer 18 arranged on said second wave guiding layer.

Furthermore, the laser diode of the present invention has a reflecting facet 38 with a high reflectivity for the central wavelength of the radiation emitted by the active layer 10, and an emitting facet 36 with a reflectivity suitable for uncoupling the radiation, said facets 36, 38 being located at the opposing (front and back) ends of said laser diode. The reflectivity of the reflecting facet 38 is preferably higher than 0.8, more preferably higher than 0.9 and even more preferably higher than 0.99. The reflectivity of the emitting facet 36 is lower than the reflectivity of the reflecting facet 38.

Furthermore, the laser diode of the present invention has contacts 22 and 24 for the injection of charge carriers. The structure thus formed allows charge carriers of a first polarity to enter the active layer 10 via the first contact 22, the first cladding layer 14 (here n-conducting) and the first wave guiding layer 12 (here n-conducting), and also allows charge carriers of the opposite polarity to enter the active layer 10 via the second contact 24, the second cladding layer 18 (here p-conducting) and the second wave guiding layer 16 (here p-conducting), said charge carriers of a first and the opposite polarity recombining in said active layer, thus causing an emission. The facets 36, 38 form a cavity, thus facilitating the operation as a laser.

The laser diode of the present invention is designed as a broad area laser, that is, the minimum width of the active region is 10 μm, preferably between 20 and 800 μm and more preferably between 30 and 400 μm. A high output power can be achieved by pumping large areas. The active region is the region enclosed between the contacts 22, 24, said region being defined in the embodiment through a vertical projection of the narrower contact 24. Due to the heating especially in the active region directly below the contact stripe 24, a thermally induced waveguide is created which, with increased output power, excites stable higher order lateral modes, which can cause an unwanted lateral widening of the emitted radiation.

To suppress higher order lateral modes, an anti-wave guiding layer 20 on both sides of the active region is provided according to the present invention, wherein the anti-wave guiding layer 20 has a lateral distance $d_x$ between 0 and 50 μm (preferably between 5 and 50 μm and more preferably between 10 and 50 μm) to the active region, and also has a refractive index which, in the present embodiment, is larger than the effective refractive index $n1_{eff}$ in the active region. This makes it possible to implement a resonant uncoupling of higher order lateral modes, which has the advantage of leading to a small far-field divergence of the emitted radiation. The resonance between the central waveguide and the anti-wave guiding regions creates a very high loss, but only if there is spatial overlapping between the modes in the stripe region and the modes in the anti-wave guiding regions. Using a lateral distance allows for tailoring the uncoupling strength and hence the loss.

Figure 2B:
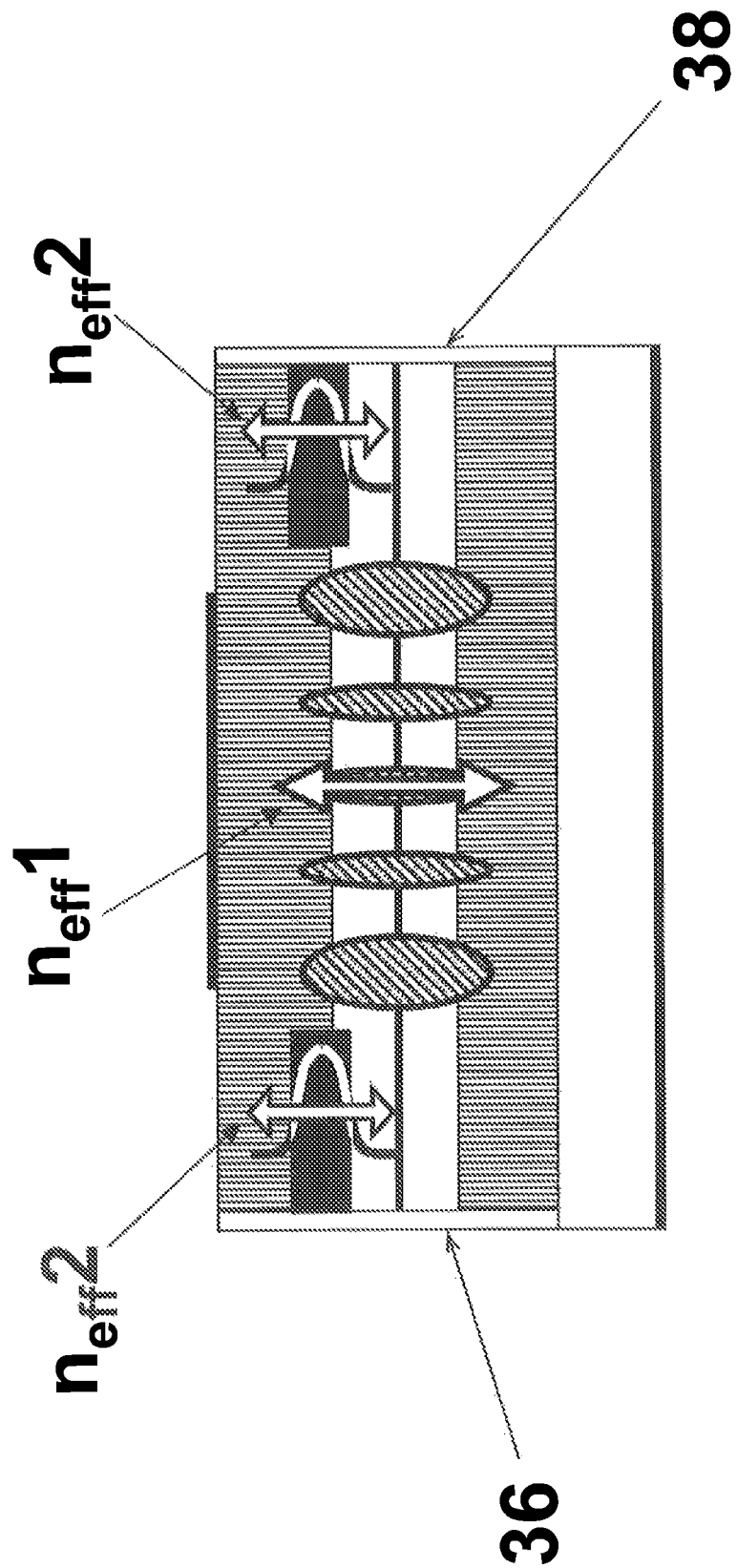
FIG. 2b shows those regions of a broad area laser of the present invention which are relevant for determining the values of $n_{eff}1$ and $n_{eff}2$.

FIG. 2b illustrates the two regions of a broad area laser of the present invention which are relevant for determining the values of $n_{eff}1$ and $n_{eff}2$.

Figure 3E:
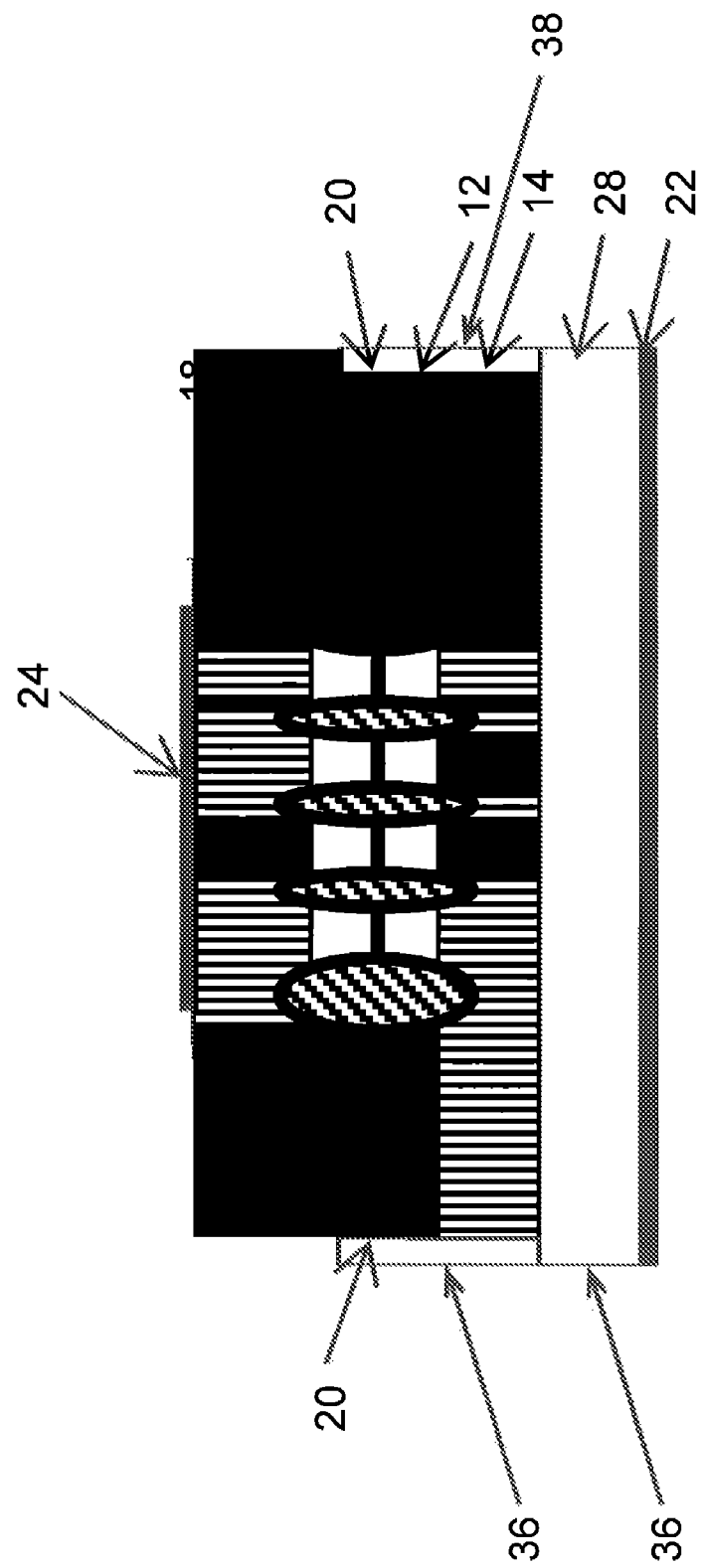
Figure 3F:
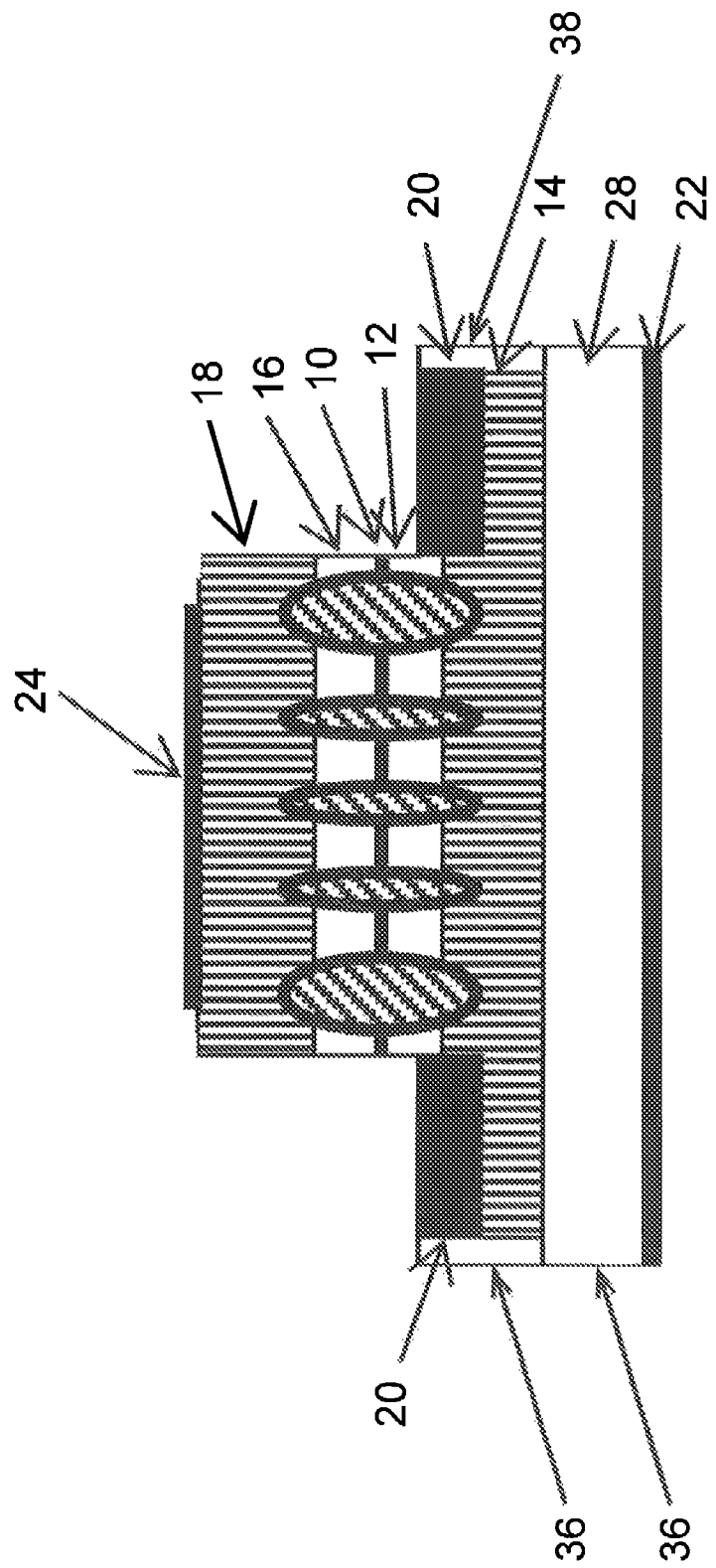
Figure 3G:
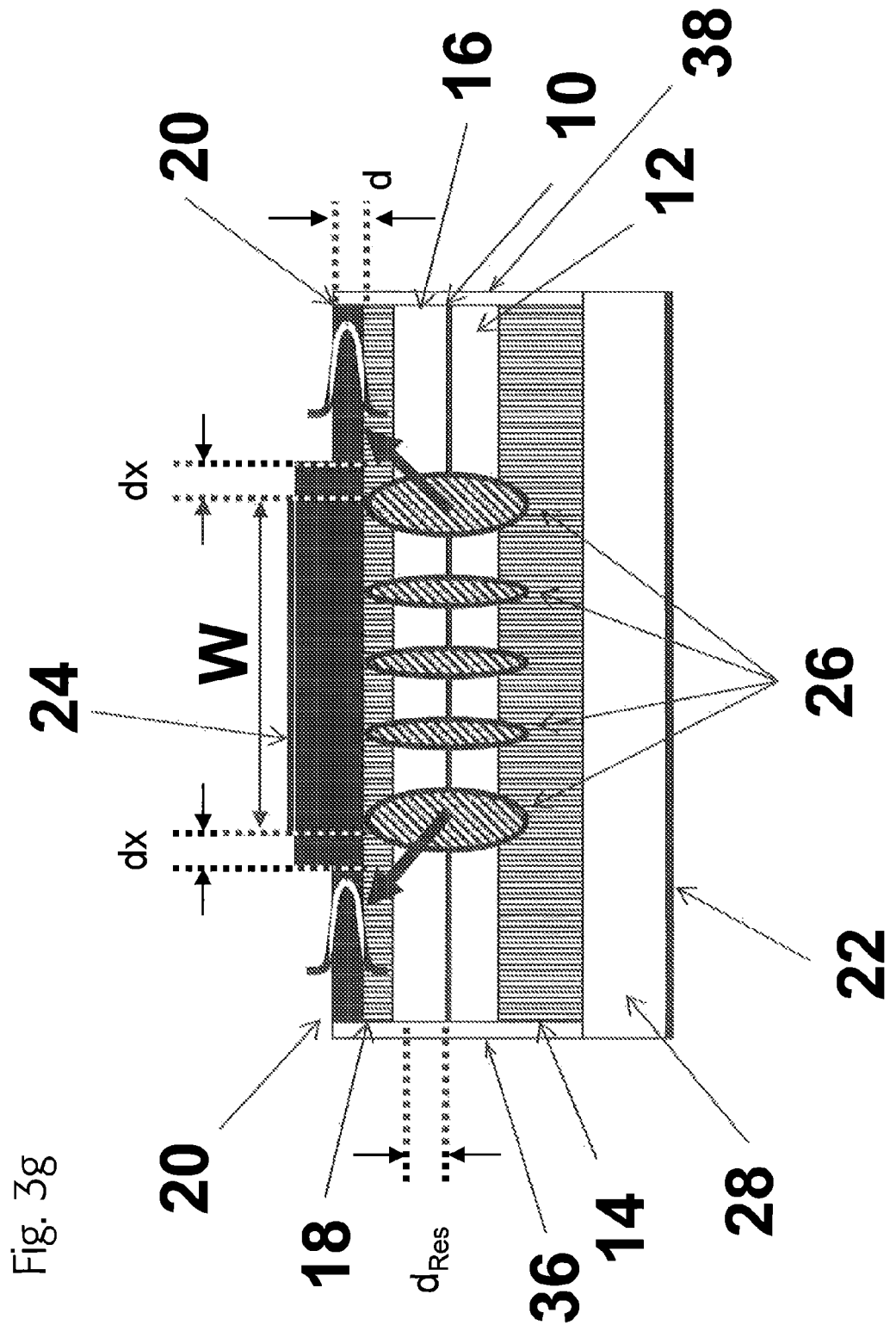

FIGS. 3a to 3g show the different possibilities of implementing the anti-wave guiding layers 20 as buried layers or as surface layers. As can be seen here, the anti-wave guiding layers 20 may be implemented as a buried layer (FIGS. 3a to 3c), in which case, consequently, the diode laser has no ridge waveguide. Alternatively, the anti-wave guiding layers 20 may be implemented as a surface layer (FIGS. 3d to 3f), in which case a ridge waveguide can be formed. In FIGS. 3a-3f, the anti-wave guiding layers 20 are positioned vertically inside the cladding layers 14, 18, preferably inside the region of the wave guiding layers 12, 16 (FIGS. 3b and 3e). An alternative embodiment is illustrated in FIG. 3g. There the anti-wave guiding layer 20 is positioned above the second cladding layer 18, and the second cladding layer 18 is designed in such a way that coupling is possible. The anti-wave guiding layer 20 is made of GaAs by structuring the contact layer 24.

Figure 4:
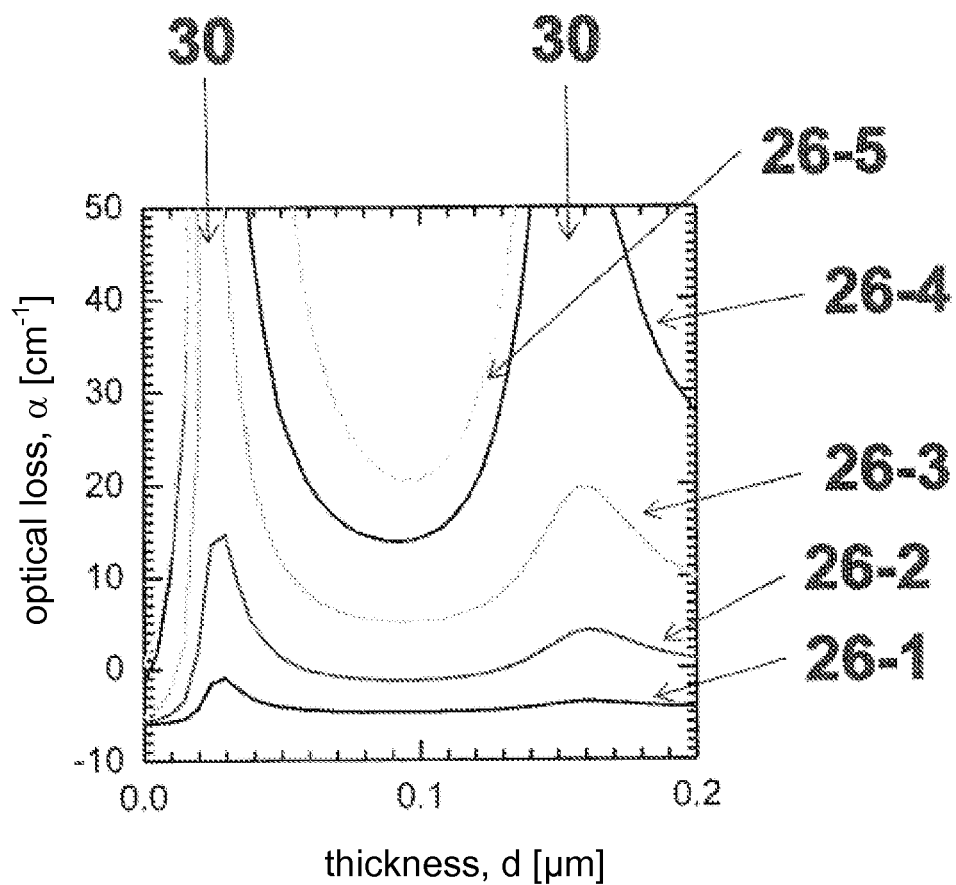
FIG. 4 shows the dependency of the resonant loss of the higher order lateral modes on the layer thickness of the anti-wave guiding layer, using a preferred embodiment as an example.

FIG. 4 shows the dependency of the resonant loss of the lateral modes from the 1st order (26-1) to the 5th order (26-5) on the layer thickness (d) of the anti-wave guiding layer 20, using a preferred embodiment according to FIG. 3d as an example. The laser structure outside the anti-wave guiding layer 20 exactly corresponds to the laser structure published by C. M. Schultz et al. Electron. Lett. 46, 580 (2010), i.e. the laser structure disclosed by Schultz et al. has no anti-wave guiding layer. The anti-wave guiding layer 20 in the present embodiment is made of germanium which has a refractive index of $n_{AWL}=5$ and an extinction coefficient of $k_{AWL}=0.3$ at the central laser wavelength of the active layer of 975 nm. The stripe width W of the second contact is 10 μm, the lateral distance is $d_x=0$ and the vertical distance from the active layer 10, i.e. the remaining layer thickness, is $d_{res}=500$ nm (for the definition of $d_x$ and $d_{res}$ cf. FIG. 2).

As illustrated in FIG. 4, a resonant loss 30 occurs if the layer thickness of the anti-wave guiding layer 20 is in the region of 10 nm to 50 nm or in the region of 120 nm to 230 nm. In particular, resonances occur at 30 nm and at 170 nm. There are thus different layer thicknesses of the anti-wave guiding layer 20 at which the higher order lateral modes can be suppressed efficiently. The loss of the higher order lateral modes increases with increasing order of the modes due to their diverse lateral extent—there is multiple spatial overlap between the higher order lateral modes and the region of the anti-wave guiding layer 20.

Figure 5:
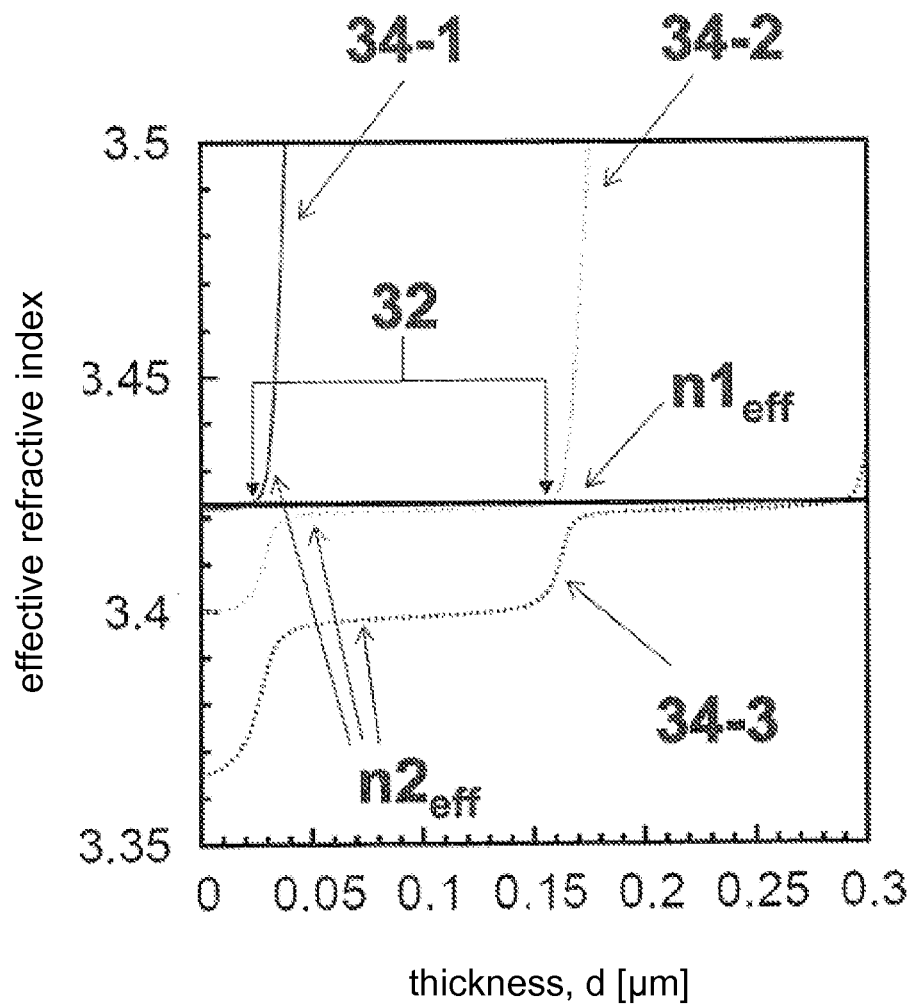
FIG. 5 shows the dependency of the effective refractive indices $n1_{eff}$ in the active region and $n2_{eff}$ in the region to the side of the active region on the layer thickness of the anti-wave guiding layer for different higher order lateral modes.

FIG. 5 shows the dependency of the effective refractive index $n1_{eff}$ in the active region, on the one hand, and the dependency of the effective refractive index $n2_{eff}$ in the region to the side of the active region, on the other hand, on the layer thickness of the anti-wave guiding layer 20 for different higher order anti-waveguide modes (34-1, 34-2, 34-3). However, the effective refractive index $n2_{eff}$ (34-1, 34-2, 34-3) in the region to the side of the active region varies for the individual higher order modes. An efficient uncoupling of the higher order modes can be effected in particular for layer thicknesses of the anti-wave guiding layer 20 where the effective refractive index $n1_{eff}$ is equal or almost equal to the effective refractive index $n2_{eff}$, in other words, where resonances 30 occur. This is the case for the 1st order anti-waveguide mode at 30 nm and for the 2nd order anti-waveguide mode at 170 nm.

REFERENCE SYMBOL LIST 10 active layer
12 first wave guiding layer (n-conducting)
14 first cladding layer (n-conducting)
16 second wave guiding layer (p-conducting)
18 second cladding layer (p-conducting)
20 anti-wave guiding layer
22 first contact layer (first contact)
24 second contact layer (second contact)
26 higher order lateral mode
26-i i-th order lateral mode
28 substrate
30 resonant loss
32 resonance
34-i refractive index of i-th order lateral mode
36 emitting facet
38 reflecting facet
W width of second contact layer
d thickness of anti-wave guiding layer
$d_x$ lateral distance between anti-wave guiding layer and active region
$d_{Res}$ vertical distance between anti-wave guiding layer and active layer

What is claimed is:
1. A diode laser, comprising:
a first contact for the injection of charge carriers,
a first cladding layer, wherein the first contact contacts the first cladding layer, a first wave guiding layer arranged on the first cladding layer, an active layer suitable for emitting radiation, said active layer being arranged on the first wave guiding layer, a second wave guiding layer arranged on the active layer, and a second cladding layer arranged on the second wave guiding layer, and a second contact for the injection of charge carriers, wherein the second contact contacts the second cladding layer, and wherein the active layer, the first contact and the second contact each extend at least partially between an emitting facet and a reflecting facet, wherein the active layer, the first contact and the second contact each have a width larger than 10 µm, and that an anti-wave guiding layer is positioned outside the active region enclosed between the contacts, wherein the refractive index of the anti-wave guiding layer is larger than the minimum refractive index of the cladding layers, and wherein the minimum distance between the anti-wave guiding layer and a projection of one of the contacts on the plane of the anti-wave guiding layer lies between 0 and 100 µm.

2. The diode laser of claim 1, wherein the anti-wave guiding layer is positioned completely outside the active region enclosed between the contacts.

3. The diode laser of claim 1, wherein the thickness of the anti-wave guiding layer and the refractive index of the anti-wave guiding layer meet the condition (1):

$$|n1_{eff} - n2_{eff}| < 0.15 \tag{1}$$

wherein $n1_{eff}$ is the effective refractive index in the active region and $n2_{eff}$ is the effective refractive index in the region of the anti-wave guiding layer.

4. The diode laser of claim 1, wherein the thickness of the anti-wave guiding layer and the refractive index of the anti-wave guiding layer meet the condition (2):

$$|n1_{eff} - n2_{eff}| < 0.10. \tag{2}$$

5. The diode laser of claim 1, wherein the thickness of the anti-wave guiding layer and the refractive index of the anti-wave guiding layer meet the condition (3):

$$|n1_{eff} - n2_{eff}| < 0.05. \tag{3}$$

6. The diode laser of claim 1, wherein the minimum distance between the active layer and the anti-wave guiding layer is smaller than or equal to the sum of the thickness of the first cladding layer and the thickness of the first wave guiding layer.

7. The diode laser of claim 1, wherein the minimum distance between the active layer and the anti-wave guiding layer is smaller than the sum of the thickness of the second cladding layer and the thickness of the second wave guiding layer.

8. The diode laser of claim 1, wherein the first cladding layer and the first wave guiding layer are n-conducting and the second cladding layer and the second wave guiding layer are p-conducting, wherein the minimum distance between the active layer and the anti-wave guiding layer amounts to between 40% and 100% of the thickness of the second wave guiding layer.

9. The diode laser of claim 1, wherein the minimum distance between the anti-wave guiding layer and a projection of one of the contacts on the plane of the anti-wave guiding layer lies between 0 and 50 µm.

10. The diode laser of claim 1, wherein the minimum distance between the anti-wave guiding layer and a projection of one of the contacts on the plane of the anti-wave guiding layer lies between 10 and 50 µm.

11. The diode laser of claim 1, wherein the active layer, the first contact and the second contact each have a width between 20 and 800 µm.

12. The diode laser of claim 1, wherein the active layer, the first contact and the second contact each have a width between 30 and 400 µm.

13. The diode laser of claim 1, wherein the anti-wave guiding layer is made of germanium or gallium arsenide.

* * * * *